US006563356B2

(12) United States Patent
Fulkerson

(10) Patent No.: US 6,563,356 B2
(45) Date of Patent: *May 13, 2003

(54) FLIP-FLOP WITH TRANSMISSION GATE IN MASTER LATCH

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/083,030

(22) Filed: Feb. 26, 2002

(65) Prior Publication Data

US 2002/0093368 A1 Jul. 18, 2002

Related U.S. Application Data

(63) Continuation-in-part of application No. 09/420,684, filed on Oct. 19, 1999, now Pat. No. 6,417,711.

(51) Int. Cl.[7] .............................................. H03K 3/289
(52) U.S. Cl. ....................... 327/203; 327/210; 327/211; 327/215; 327/218
(58) Field of Search ................................. 327/202, 203, 327/208, 210–215, 218, 219

(56) References Cited

U.S. PATENT DOCUMENTS

| 4,495,629 | A | | 1/1985 | Zasio et al. ................. 327/202 |
| 5,025,174 | A | | 6/1991 | Shikata ........................ 327/202 |
| 5,140,179 | A | * | 8/1992 | Takano ........................ 327/203 |
| 5,173,870 | A | * | 12/1992 | Sukashita et al. ............ 327/208 |
| 5,281,865 | A | * | 1/1994 | Yamashita et al. ........... 327/202 |
| 5,621,340 | A | | 4/1997 | Lee et al. ...................... 327/65 |
| 5,787,011 | A | | 7/1998 | Ko ................................. 716/2 |
| 5,818,293 | A | | 10/1998 | Brehmer et al. ............. 327/202 |
| 5,831,463 | A | | 11/1998 | Sachdev ...................... 327/202 |
| 5,880,599 | A | | 3/1999 | Bruno .......................... 326/56 |
| 5,889,422 | A | | 3/1999 | Komoike et al. ............ 327/208 |
| 5,920,218 | A | | 7/1999 | Klass et al. .................. 327/200 |
| 6,417,711 | B2 | * | 7/2002 | Fulkerson .................... 327/203 |

FOREIGN PATENT DOCUMENTS

| DE | 4007223 A1 | 9/1990 |
| EP | 0467273 | 1/1992 |
| JP | 61 087422 A | 5/1986 |
| JP | 63 051716 A | 3/1988 |

OTHER PUBLICATIONS

Kim, et al., (1990), *IEEE Journal of Solid–State Circuits*, vol. 25, No. 4, pp. 942–951.

(List continued on next page.)

*Primary Examiner*—Terry D. Cunningham
*Assistant Examiner*—Long Nguyen
(74) *Attorney, Agent, or Firm*—McDonnell Boehnen Hulbert & Berghoff

(57) ABSTRACT

A method and apparatus for storing data in a master flip flop, comprising in combination receiving a clock signal having a first and second state, storing a master data state in a master storage device having a master storage input and a master storage output, storing a master complement data state in a master complement storage device having a master complement storage input and a master storage complement output, receiving a data input signal by a transmission gate, receiving a complement data input signal by a complement transmission gate, overriding the master storage complement output with the data input signal when the clock is in the first state, overriding the master storage output with the complement data input signal when the clock is in the first state, disconnecting the master storage complement output from the data input signal when the clock is in the second state, and disconnecting the master storage output from the complement data input signal when the clock is in the second state. The set-up time for the transmission gate is less than two transistor gate delays.

22 Claims, 10 Drawing Sheets

OTHER PUBLICATIONS

J.B. Burr et al, (1994), "A 200 mV Self–testing Encoder/decoder using Stanford Ultra–low–power CMOS", *ISSCC 94 Conference Digest*, pp. 84–85.

V. Stojanovic et al., (Apr. 1999), "Comparative Analysis of Master–Slave Latches and Flip–flops for High–Performance and Low–power Systems", *IEEE Journal of Solid–State Circuits*, vol. 34, No. 4, pp. 536–548.

Markovic et al., (Spring 1999), *EECS 241, Final Project Report*, "Implementation of Digital Controller for An Interleaved DC/DC Buck Converter", pp 1–6.

Neil H.E. Weste, Principle of CJOS VLSI Design, $2^{nd}$ edition 1993, Addison–Wesley Publishing Company, p. 91.

* cited by examiner

FLIP-FLOP WITH TRANSMISSION GATE IN MASTER LATCH

This is a Continuation-in-part of prior application Ser. No. 09/420,684 filed Oct. 19, 1999, now U.S. Pat. No. 6,417,711.

PRIORITY

This application claims priority to and incorporates by reference U.S. patent application Ser. No. 09/420,684 entitled "High Speed Latch and Flip-flop" Filed Oct. 19, 1999.

FIELD

The device and method described relate generally to storage devices, and more particularly, the device and method relate to flip-flops.

BACKGROUND

Advances in integrated circuit technology and design have led to a rapid increase in integrated circuit performance. A good example of this increase in performance can be seen in microprocessors. Only a few years ago, state-of-the-art microprocessors shipped with personal computers had clock rates of around 60 MHz. Today, personal computers are commonly shipped with microprocessors having clock rates of 2 GHz or more. Accordingly, it would be desirable to increase the speed of computers, microprocessors and digital circuits

SUMMARY

A latch and flip-flop circuit is described having a reduced clock-to-Q delay. Additionally, the latch and flip-flop has a reduced set-up time. Set-up time is the minimum time required between a data input and the clock. Reductions in clock-to-Q delay and set-up time may result in increased microprocessor clock speeds and higher performance computer systems.

The latch and flip-flop circuits may have both a data input signal and a complement data input signal. The data input signal and the complement data input signals are selectively connected to opposite sides of a pair of cross-coupled storage devices of the latch or flip-flop to function as a storage device. The data input signal may be coupled to the storage device via a transmission gate, switch or the like. The transmission gate or switch may be controlled by an enable signal such as a clock signal. When the transmission gate or switch is enabled, the data input signal overrides the complement storage device output signal. Similarly, the complement data input signal overrides the storage device output signal.

Because the data input signal overrides the complement storage device output signal, and the complement data input signal overrides the storage device output signal, the set up time and the clock-to-Q time may be reduced relative to conventional devices. In addition, because the data input signal and the complement data input signal drive opposite sides of the pair of cross-coupled gates, each through a single logic gate, the state of the pair of cross-coupled gates can be set in only one gate delay. This helps reduce the clock-to-Q time, as well as the set-up time. In one embodiment, the set-up time of the master latch is equal to the gate delay of the transmission gate at the input to the master latch.

In a first illustrative embodiment, the data input signal and the complement data input signal are provided to a first switch and a second switch, respectively, of the latch circuit. Each of the first and second switches may for example, have a transmission gate or an inverter type gate having a tri-stateable output. The state of the output of each of the inverter type gates may be controlled by an enable signal such as a clock signal. When the first switch and the second switch are enabled, the first switch passes the data input signal to a first side of a pair of cross-coupled inverters and the second switch passes the complement data input signal to a second opposite side of the cross-coupled inverters. The latch preferably has a data output terminal that corresponds to the output of the first side of the cross-coupled inverters and a complement data output terminal that corresponds to the output of the second side of the cross-coupled inverters.

An illustrative master-slave flip-flop of the present invention combines two of the latch circuits discussed above. In this embodiment, the data output terminal of the master latch is connected to a data input terminal of the slave latch, and the complement data output terminal of the master latch is connected to the complement data input terminal of the slave latch. For a positive edge triggered flip-flop, the first and second switch elements of the master latch are enabled when the clock signal transitions from a high state to a low state, and the first and second switch elements of the slave latch are enabled when the clock signal transitions from a low state to a high state.

It is contemplated that each of the first and second switch elements of the master latch and slave latch may be implemented in a number of ways. For example, each of the first and second switch elements may be formed from a single transistor, with the gate of the single transistor coupled to the clock signal. Alternatively, each of the first and second switch elements may be formed from a transmission gate. The transmission gate may have an n-channel transistor an d a p-channel transistor, with the gate of the n-channel transistor coupled to a clock signal and the gate of the p-channel transistor coupled to a complement clock signal, or visa versa. Further still, the first and second switch elements may be formed from an inverter type transistor gate having a tri-stateable output, with the state of the output controlled by a clock and/or complement clock signal delayed by one transistor delay. In this latter case, the switching function of the first and second switch elements may be combined into a single circuit, which as described below, may reduce the number of transistors required to form the switching element circuits.

BRIEF DESCRIPTION OF THE DRAWINGS

Preferred embodiments are described below in conjunction with the appended drawing figures, wherein like reference numerals refer to like elements in the various figures, and wherein.

DETAILED DESCRIPTION

Figure 1:
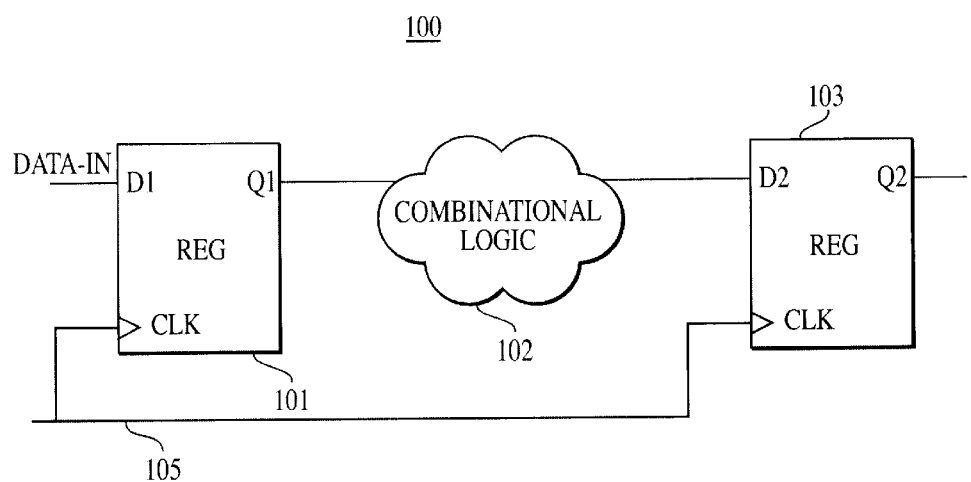
FIG. 1 is a schematic diagram of a delay path of an exemplary typical digital circuit.

Referring to FIG. 1, a digital circuit 100 is illustrated. It should be understood that many of the elements described and illustrated throughout this specification are functional in nature and may be embodied in one or more physical entities or may take other forms beyond those described or depicted.

FIG. 1 shows a delay path within a digital circuit 100. Such delay paths are commonly used in microprocessors and other digital circuits. A exemplary delay path includes a first flip-flop 101, a second flip-flop 103 and a combinational logic block 102 located in between. As shown in FIG. 1, both the first flip-flop 101 and the second flip-flop 103 are clocked by a common clock signal 105. For purposes of illustration, both the first flip-flop 101 and the second flip-flop 103 are assumed to be positive edge triggered master-slave flip-flops.

Figure 2:
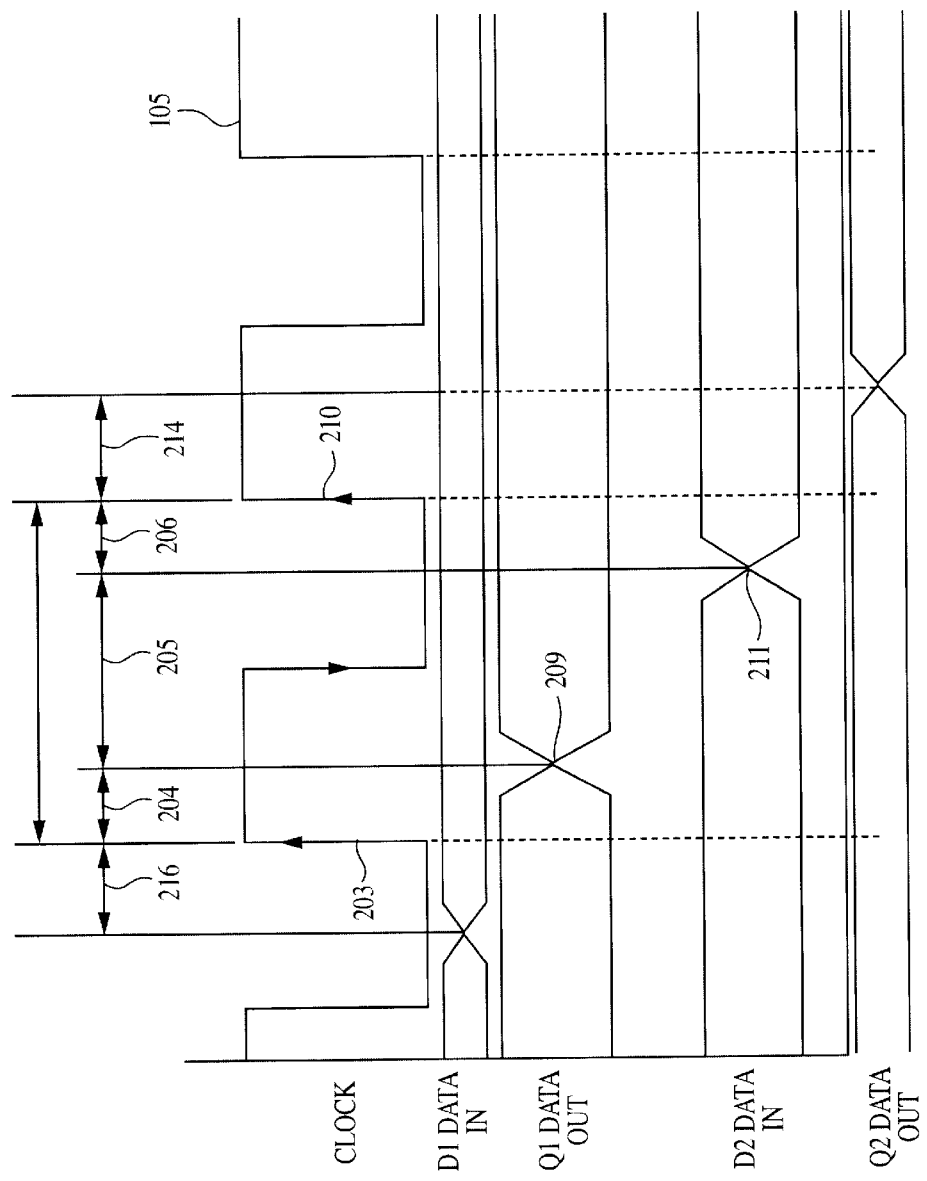
FIG. 2 is a timing diagram for the delay path of FIG. 1.

In operation, and as shown in FIG. 2, the first flip-flop 101 releases data to the combinational logic 102 at a first positive edge of the clock signal 203. There is typically a delay 204, commonly referred to as a clock-to-Q delay, before the data actually emerges from the output Q1 of first register 101. The Q1 data output emerging from the first flip-flop 101 is shown at 209 in FIG. 2. The clock-to-Q delay 204 may correspond to the time required to propagate the data signal through the slave of the master-slave flip-flop 101, as further described below. Once the data emerges from the first flip-flop 101, the data propagates through the combinational logic block 102, and arrives at the data input of the second flip-flop 103 at least one set-up time 206 before the next positive edge of the clock signal 105. The arrival of the data at the data input of the second flip-flop is shown at 211 in FIG. 2. The set-up time 206, 216 corresponds to the time required to provide data 211 at the data input D2, D1 respectively prior to the clock trigger 210 of the master-slave flip-flop, as further described below.

To maximize the performance of the digital circuit 100, it is desirable to minimize the clock-to-Q delay 204, 214 and the set-up time 206, 216. This leaves the maximum amount of propagation time 205 for the data to travel through the combinational logic block 102. Additionally, by reducing the clock-to-Q delay 204 and/or the set-up time 206, the clock frequency of the clock signal 105 can be increased, thereby increasing the performance of the corresponding digital circuit. Alternatively, a longer delay path can be provided in the combinational logic block 102, which may help reduce the number of pipeline stages often required in many of today's microprocessors.

Figure 3:
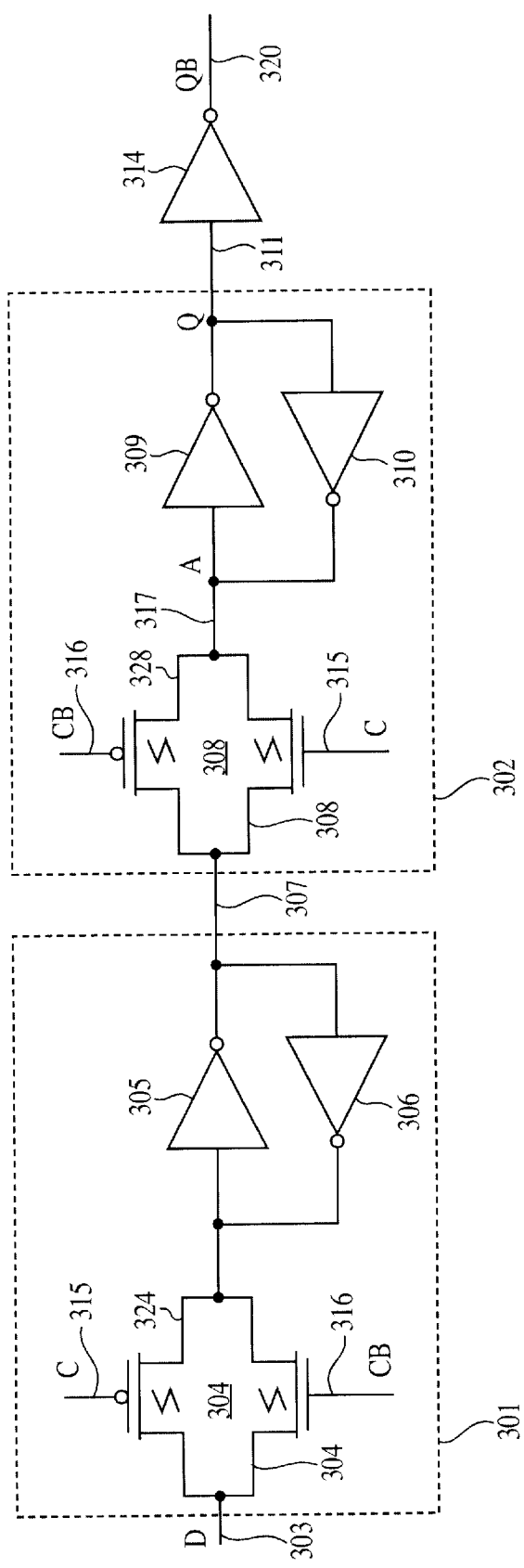
FIG. 3 is a schematic diagram of an exemplary flip-flop circuit.

FIG. 3 is a schematic diagram of a master-slave flip-flop with looped inverters. The flip-flop includes a master latch 301 and a slave latch 302, with the output of the master latch 301 coupled 307 to the input of the slave latch 302. The master latch 301 is switched on and the slave latch 302 is switched off when the clock signal 315 is low and the complement clock 316 is high. The master latch 301 is switched off and latched and the slave latch 302 is switched on when the clock signal 315 is high and the 316 is low.

The master latch 301 includes a pair of looped inverters 305 and 306 forming an inverter loop. One side of the master looped inverters is coupled to a data output terminal 307, and the other side of the looped inverters is coupled to the data input terminal 303 of the master-slave flip-flop through a transmission gate 304. The transmission gate 304, connects the data input terminal 303 of the master-slave flip-flop to the input of the first inverter 305 and the output of the second inverter 306 when the clock signal 315 is low (and thus the complement clock signal 316 is high). After the transmission gate 304, is on, the master latch 301 allows the data input signal 303 to then set the state of the looped inverters 305 and 306.

The transmission gate 304, disconnects the data input terminal 303 from the input of the first inverter 305 and the output of the second inverter 306 when the clock signal 315 is high (and thus the complement clock signal 316 is low). In this state, the master latch 301 is switched on, allowing the looped inverters 305 and 306 to store the state set by the data input signal 303.

Like the master latch 301, the slave latch 302 includes a pair of looped inverters 309 and 310. One side of the looped inverters 309, 310 is coupled to a data output terminal 311, and the other side of the looped inverters is coupled to the master output terminal 307 of the master latch 301 through transmission gate 308. The transmission gate 308, connects the master output terminal 307 of the master latch 301 to the input of the first inverter 309 and the output of the second inverter 310 when the clock signal 315 is high (and thus the complement clock signal 316 is low). In this state, the slave latch 302 is switched on, allowing the signal on the master output 307 of the master latch 301 to set the state of the looped inverters 309, 310.

The transmission gate 308, disconnects the master output terminal 307 of the master latch 301 from the input of the first inverter 309 and the output of the second inverter 310 when the clock signal 315 is low (and thus the complement clock signal 316 is high). In this state, the slave latch 302 is latched, allowing the looped inverters 309 and 310 to store the state set by the signal on the master output 307.

During operation, the clock signal 315 may initially be low and the complement clock signal 316 may be high. At this time, the master latch 301 is switched on, allowing the data input signal 303 to enter the master latch 301 and set the state of the looped inverters 305 and 306. The slave latch 302 is in a latched state, preventing the signal on the master output 307 of the master latch 301 from reaching the looped inverters 309 and 310 of the slave latch 302.

The data input signal 303 must be stable for a sufficient period to set the state of the looped inverters 305 and 306 to a desired state before the clock signal 315 rises and the complement clock 316 falls. As indicated above, this is referred to as the set-up time of the master-slave flip-flop. For the master-slave flip-flop shown in FIG. 3, the set-up time corresponds to about two gate delays, consisting of the delay through the transmission gate 304, and the first inverter 305 to produce a signal on the master output 307. When the clock signal 315 rises (and thus the complement clock signal 316 falls), the transmission gate 304, disconnects the data input signal 303 from the pair of looped inverters 305 and 306. The pair of looped inverters 305 and 306 then maintain or store the data state set as a result of the prior set-up period.

Also, when the clock signal 315 rises, and the complement clock 316 falls, the slave transmission gates 308, 328 of the slave latch 302 switch on, passing the data state stored in the master latch 301 to the output 311 of the master-slave flip-flop 301. That is, the rising edge of the complement clock signal 316, and the falling edge of the clock 315 falls, turns on the transmission gate 308, of the slave latch 302, which then allows the data state on the master output terminal 307 of the master latch 301 to eventually propagate to the output terminal 311 of the slave latch 302. For the slave latch 302 shown, the clock-to-Q delay corresponds to two gate delays, consisting of the delay through the transmission gate 308, and the first inverter 309. If a complement output signal 320 is desired, the clock-to-QB delay is increased to three gate delays with the addition of inverter 314. The data-to-clock and clock-to-Q delay times discussed are based on inverters 305, and 309, having a single gate delay. However, if inverters 305, and 309, have more than one gate delay, then the data-to-clock and clock-to-Q times would be correspondingly longer.

Figure 4:
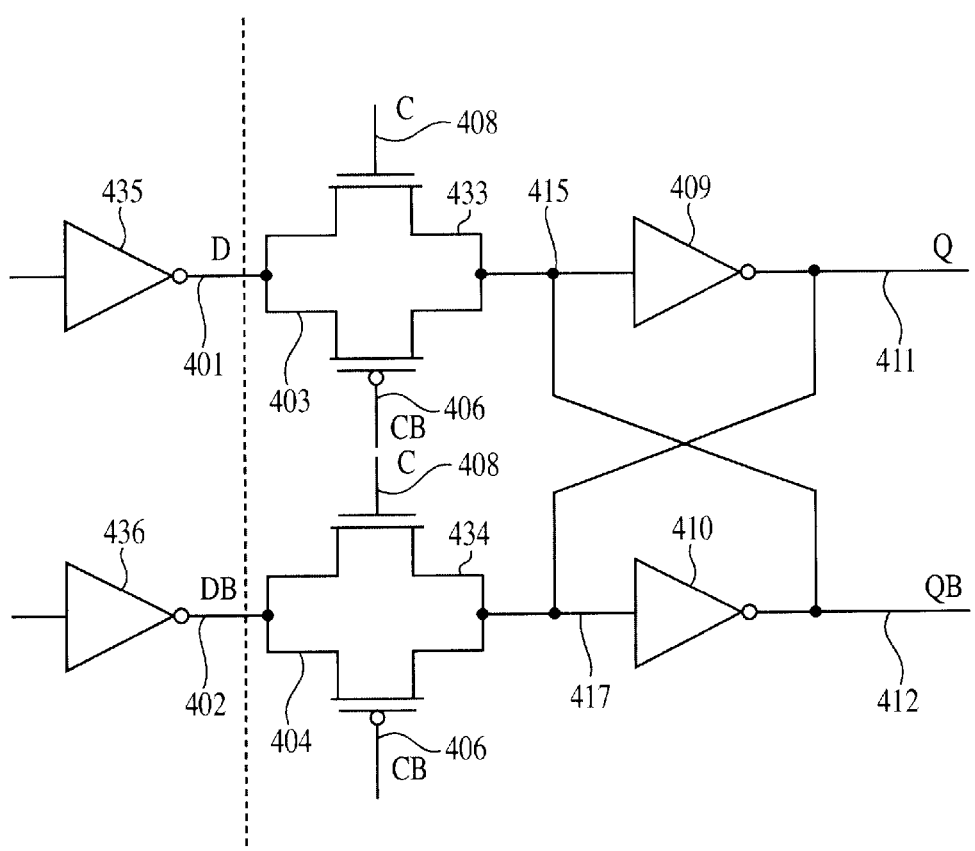
FIG. 4 is a schematic diagram of an illustrative latch in accordance with the present invention.

FIG. 4 is a schematic diagram of an illustrative latch in accordance with the present invention. The latch includes a pair of inverters 409 and 410 coupled together in a cross-coupled configuration. While cross-coupled inverters are shown in FIG. 4, it is contemplated that other types of gates may be used, such as AND, NAND, OR, NOR, XOR, XNOR gates, etc. These alternative gates may be desirable when forming, for example, D flip-flops, RS flip-flops, and JK-flip-flops, etc.

A first side 415 of the pair of cross-coupled inverters 409 and 410 is preferably coupled to the data input terminal 401 of the latch when transistors 403, 433 are switched on. Similarly, a second side 417 of the pair of cross-coupled inverters 409 and 410 is preferably coupled to the complement data input terminal 402 of the latch when second switch elements 404, 434 are switched on.

Each of the input and complement input switch elements 403, 433 and 404, 434 are shown as transistors having a tri-stateable output. As indicated above, however, it is contemplated that the input and complement input switch elements 403, 433 and 404, 434 may be implemented using, for example, a single transistor or a transmission gate, etc. The input and complement input switch elements 403, 433 and 404, 434 are preferably controlled by a clock signal 408 and a complement clock signal 406, as shown.

In this configuration, when the clock signal 408 is high, and the complement clock signal 406 low, the first transistors 403, 433 are turned on and connect the data input signal 401 of the latch to the first side 415 of the pair of cross-coupled inverters 409 and 410. Likewise, the complement input switch transistors 404, 434 are turned on to connect the complement data input signal 402 of the latch to the second side 417 of the pair of cross-coupled inverters 409 and 410.

When the clock signal is low, and the complement clock signal is high, the input transistors 403, 433 are turned off and disconnect the data input signal 401 of the latch from the first side 415 of the pair of cross-coupled inverters 409 and 410. Likewise, the complement input transistors 404, 434 disconnect the complement data input signal 402 of the latch from the second side 417 of the pair of cross-coupled inverters 409 and 410.

As previously stated, the first side 415 of transistors 403, 433, is coupled to the output of inverter 410 (complement output 412) and the second side 417 of transistors 404, 434 is coupled to the output of inverter 409 (output 411). In order to avoid output driver contention, either switch signals 415, 417 overpower storage signals 412, 411 or visa versa.

Accordingly, in one embodiment, switch outputs 415, 417 of transistors 403, 433, and 404, 434 overpower the outputs 411, 412 of inverters 410 and 409 respectively in order to avoid output driver contention. As can readily be seen, when the first and second transistors 403, 433 and 404, 434 are enabled, the data input signal 401 of the latch overrides the complement data output terminal 412. Likewise, the complement data input signal 402 overrides the data output signal 411 of inverter driver 409 after being inverted by second transistors 404, 434.

Because the first side (switch data output signal) 415 overrides the complement data output terminal 412 by the first transistors 403, 433, and the second side (switch complement data output signal) 417 overrides the data output signal 411 by the second transistors 404, 434, the clock-to-Q time of the latch may be substantially reduced relative to conventional devices. For example, both the inputs and outputs of inverters 409 and 410 may be overridden as described above by setting the signal levels of the inputs and outputs to a state that is different than the state of the inverters 409, 410 internally. The state of the inverters 409, 410 internally will then quickly change to match the state set externally by the switches.

The clock-to-Q time in this embodiment is effectively reduced to about one transistor gate delay because the output signal state 411, 412 is driven by the input signal 401, 402 via the transistor gates 403, 433, 404, 434 without having to wait for the state of the cross-coupled inverters 409, 410 to change state. The set-up time is reduced because the data input signals 401, 402 are held stable while the cross-coupled inverters 409, 410 quickly change state. Since the memory inverters 409, 410 change state relatively quickly because they are being pre-charged instead of driving another device, the set-up time now is approximately the time required for a signal to pass through parallel switch devices 403, 433, 404, 434. In contrast, conventional flip-flops typically require that the set-up time include the transistor gate delay of the switch 304, 324 and of the memory devices 305, 306.

In one embodiment, the cross-coupling connections or traces linking nodes 415 to 412 and nodes 411 to 417 do not allow a logic level difference across these cross-coupling links. As a result, the logic level at the input 415 of inverter 409 is the same as the logic level at the output 412 of inverter 410. Similarly, the logic level at the input 417 of inverter 410 is the same as the logic level at the output 411 of inverter 409. Accordingly, this facilitates the switch device output signals 415, 417 to override outputs 412, 411 respectively. Analogously, switch device output signals 415, 417 pass directly to outputs 412, 411 respectively.

In one mode, the relative drive strength of transmission gates 403, 433, and 404, 434 is stronger than inverter outputs 411, 412. Alternatively, an external driving device driving the transmission gates 403, 433, 404, 434 may provide the necessary driving power to overcome the outputs 411, 412, for inverters 409, 410. An external driving device may be, for example, an inverter, a transistor, or a logic gate such as an AND, NAND, OR, XOR, or NOR gate. These external driving devices may have a gain greater than 1 in order to provide the necessary drive power to overcome the outputs 411, 412.

The drive strength may be based upon the transmission gate or the external driving device such as the data input driver 435 having a drive current so that the data input signal overrides the master storage output. Additionally, the complement transmission gate or the external driving device such as the complement data input driver 436 may have a drive current so that the complement data input driver overrides the master storage complement output.

Figure 5:
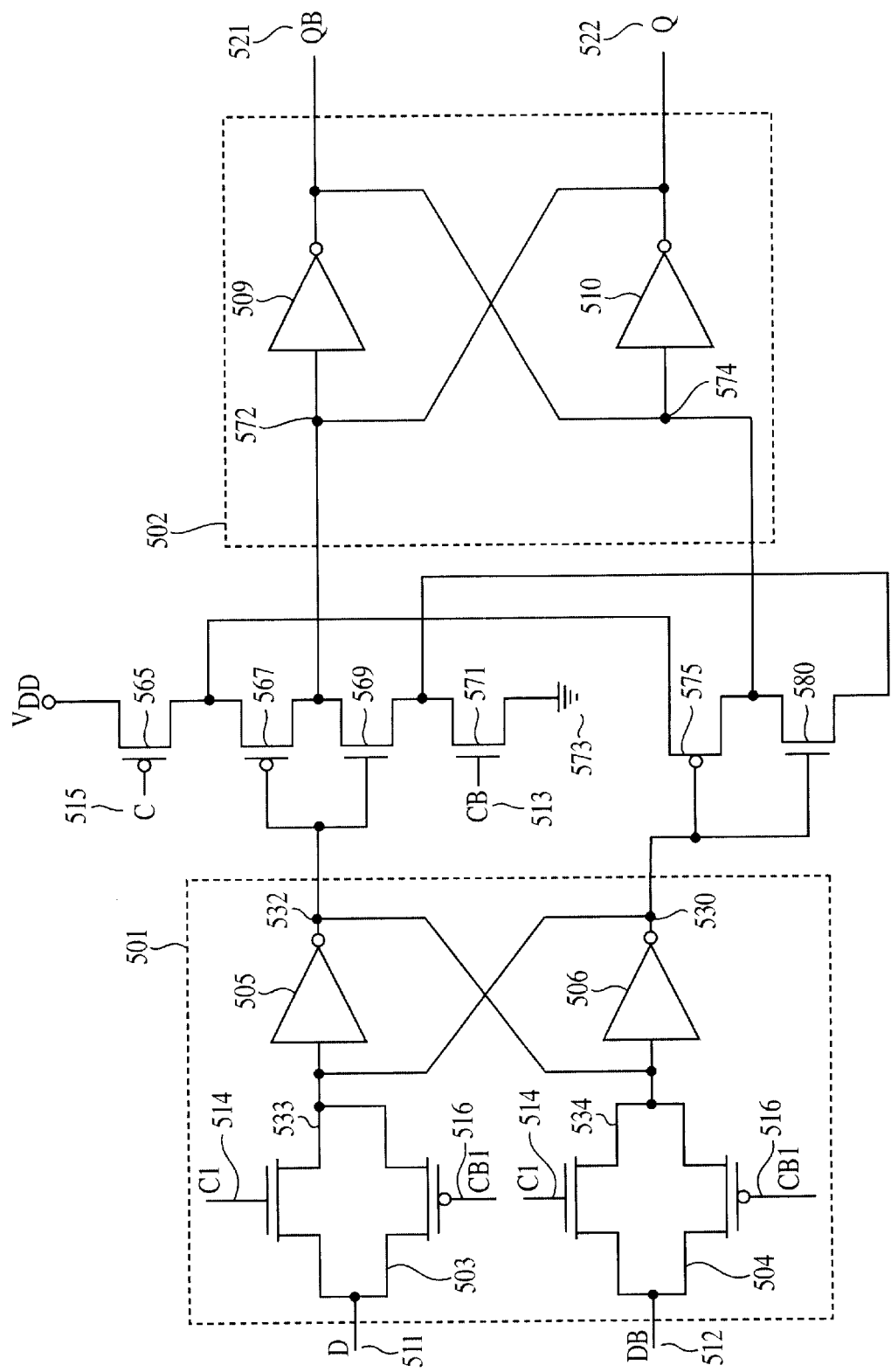
FIG. 5 is a schematic diagram of an illustrative master-slave flip-flop in accordance with the present invention.
Figure 5A:
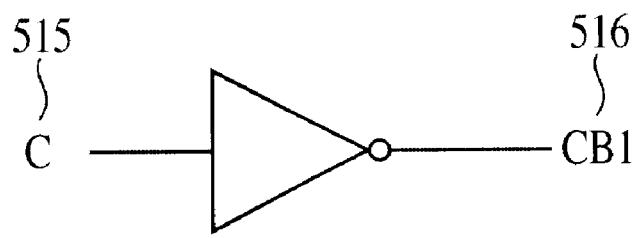
FIG. 5A is a schematic diagram of delayed clock circuit.
Figure 5A:
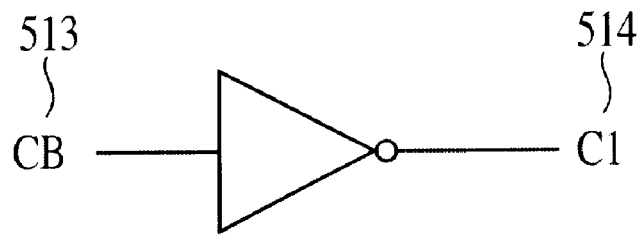

FIG. 5 is a schematic diagram of an illustrative master-slave flip-flop. As can be seen, this embodiment combines the latch of FIG. 4 and a slave latch using tri-state gates for a switch and cross-coupled inverters for memory to form the master-slave flip-flop of FIG. 5. Accordingly, the data output terminal 532 of the master latch is connected to the data input terminal (also shown as 532) of the slave latch. Similarly, the complement data output terminal 530 of the master latch is connected to the complement data input terminal (also shown as 530) of the slave latch.

The input gates 503, 533, 504, 534 of the master latch are operated by a delayed clock 514, and a complement delayed clock 516. The tri-state gates of the slave latch are operated by the clock 515, and complement clock 513. In one embodiment, delayed clock 514 is delayed by one gate delay relative to clock 515. Similarly, delayed complementary clock 516 is delayed by one gate delay relative to complement clock 513. The delayed clock 514 and the delayed complementary clock 516 may be generated by using a gate in order to create the delayed clock 514 and the delayed complementary clock 516. Since the delay may be generated using a gate, the actual delay may vary substantially based on the delay of the gate. Alternatively, the delay may be generated by another method or device such as a crystal oscillator, phase locked loop, analog or digital divider circuit, logic gate, transmission line, delay line, inverter, inductor, capacitor, inductor-capacitor etc. In another embodiment, clock signals 514, 515 are substantially identical and clock signals 513 and 516 are identical with no relative time delay.

The first and second switch transmission gates 503, 533 and 504, 534 of the master latch 501 are enabled when the delayed clock signal 514 is high and the delayed complement clock 516 is low. However, the tri-state switch gates of the slave latch 502 are enabled when the clock signal 515 is low and the complement clock 513 is high.

Figure 9:
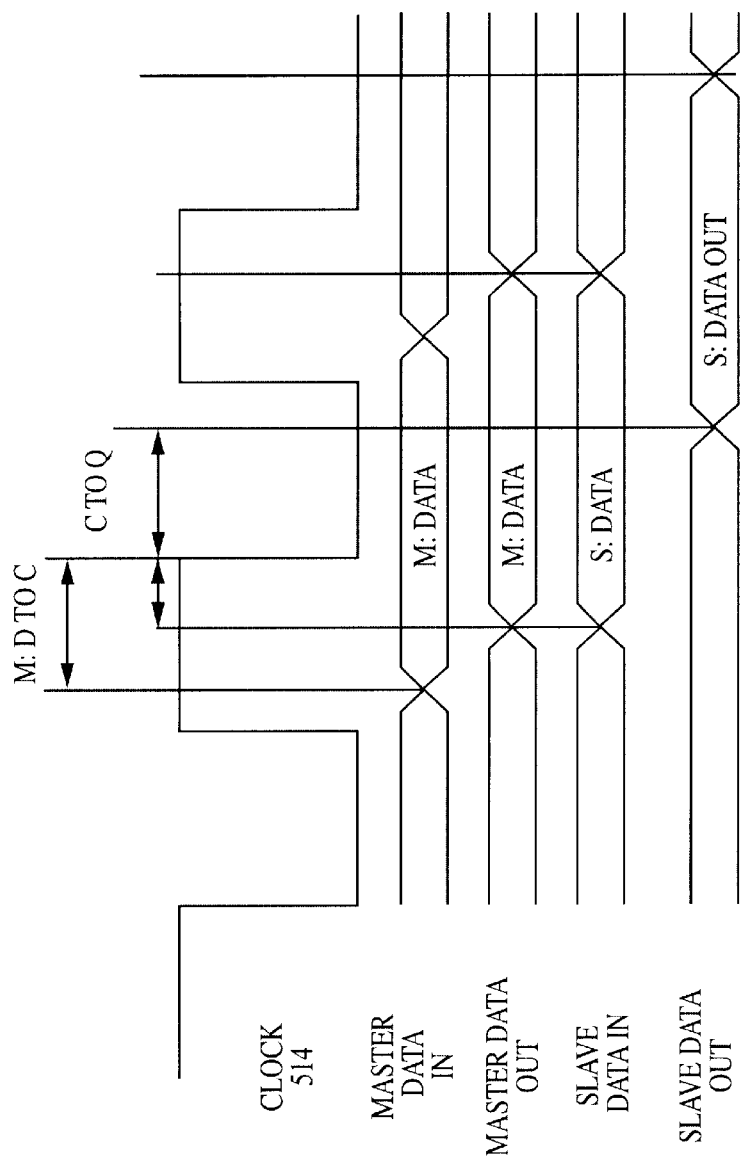
FIG. 9 is a timing diagram for the master-slave flip-flop of FIG. 5.

As shown in the timing diagram of FIG. 9, during operation, the delayed clock signal 514 may initially be low and rise to a high level while the complement clock signal 516 may initially be high and fall to a low level. At this time, pass gates 503, 533, 504, 534 turn on allowing the data input signal 511 and the complement data input signal 512 to enter the master latch 501 and set the state of the cross-coupled inverters 505 and 506. Additionally, the data input signal 511 and the complement data input signal 512 override master latch outputs 530 and 532 respectively once the transmission pass gates 503, 533, 504, 534 are on. In contrast, the slave latch 502 is in a latched state holding the previous data state, while preventing the output signals 530 and 532 of the master latch 501 from reaching the cross-coupled inverters 509 and 510 of the slave latch 502. In this state, the slave flip-flop 502 is isolated from the master flip-flop 501, so that output 521 and complement output 522 remain unchanged.

The data input signal 511 and the complement data input signal 512 must be stable for a sufficient period to set the cross-coupled inverters 505 and 506 to the desired state before the clock signal 514 rises and 516 falls. This is referred to as the set-up time of the master-slave flip-flop based on the D-C delay (data to clock) timing as shown in FIG. 9. For the master-slave flip-flop shown in FIG. 5, the set-up time corresponds to about one gate delay, or the gate delay through the first and/or second transmission gates 503, 533 and 504, 534. For example, a typical delay using CMOS 0.35 micron technology is about 30 to 60 pico-seconds. However, a shorter delay is possible using, for example, technology less than 0.35 microns or an alternative technology such as high speed CMOS or GaAs (Gailieum Arsenride). The set-up time for the flip-flop in FIG. 5, nevertheless, is substantially less than the set-up time of the flip-flop of FIG. 3, which as described above, is about two gate delays.

Upon the falling edge of the delayed clock signal 514 (and thus the rising edge of the delayed complement clock signal 516), the master switch transmission gates 503, 533 and 504, 534 disconnect the data input signal 511 and the complement data input signal 512 from the pair of cross-coupled inverters 505 and 506. The pair of cross-coupled inverters 505 and 506 then maintain or store the state set during the set-up period.

At the same time, in the slave latch 502, when the clock signal 515 falls, and complement clock 513 rises, transistor 565 of the slave latch 502 switches on. A high data state on either 532 or 530 stored in the master latch 501 results in a zero at the data output 521 of inverter 509 or the complement data output 522 of the master-slave flip-flop respectively. As previously stated, when the complement clock signal 515 falls, then P channel transistor 565 turns on. As a result, a low state on master data switch input 532 turns on P channel transistor 567 creating a high data state on master data switch output 572 resulting in a low data state at the complement output QB output 521. Similarly, a low data state at the input of master complement data switch input 530 turns on P channel transistor 575 causing a high data state on master complement switch output 574 and resulting in a low data state at output 522.

A high clock level on complement clock signal 513 turns on N channel transistor 571 of the slave latch 502. At this time, a high data state on the data switch input 532 of the master latch 501 turns on transistor 569 creating a low data state on data switch output 572 resulting in a high data state at the complement output 521 of the slave latch 502. Similarly, a high data state on switch input 530 turns on transistor 580 to create a low data state on complement data switch output 574 then resulting in a high data state at the output terminal Q 522 of the slave latch 502.

As shown in FIG. 9, as the clock 514 goes high, data 511 and complement data 512 enter both the pass gates 503, 533, 504, 534 and the cross-coupled inverters 505, 506 simultaneously. The data may be stable for the time it takes to enter the pass gates 503, 533, 504, 534. Also, the data states of the cross-coupled inverters 505, 506 do not have to wait for the output of inverters 505, 506 to change state first. As a result, the set-up time from the data to clock is based on the switching time of one of pass gates 503, 533, 504, 534 and a relatively small amount of time to set the state of the cross-coupled inverters 505, 506. Consequently, the set-up time is about one gate delay because the propagation delay of parallel pass gates 503, 533, 504, 534 and cross-coupled inverters 505, 506 is about one gate delay.

The clock-to-Q delay of the master-slave flip-flop of FIG. 5 is about one gate delay, or the gate delay through one of the first and/or second switch elements 565, 567, 569, 571, 575, 580 of the slave latch 502. This is substantially less than the clock-to-Q time of the flip-flop of FIG. 3, which as described above, is about two gate delays to produce a data output signal 411 and about three gate delays to produce a complement data output signal 412.

Figure 6:
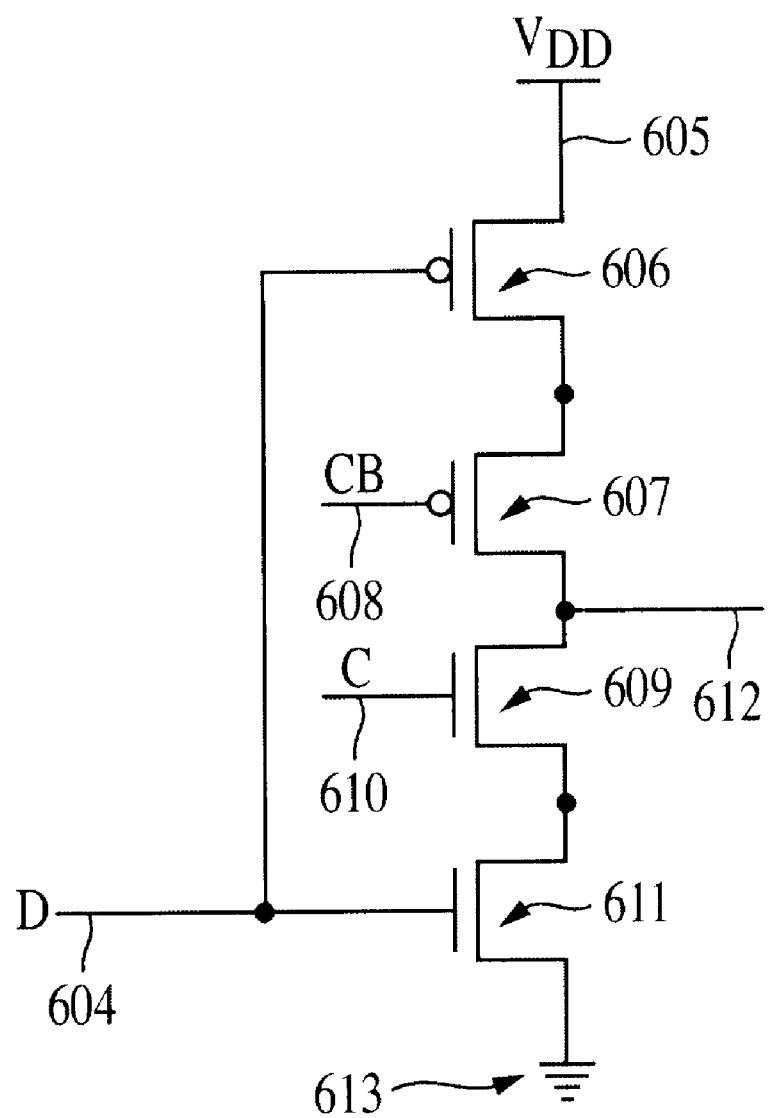
FIG. 6 is a schematic diagram of an illustrative inverter type switch having a tri-stateable output.

FIG. 6 is a schematic diagram of a switch element using inverting tri-state transistors 606, 607, 609, 611 in a totem pole configuration. Since FIG. 6 illustrates a single switch element, twin totem pole switches may be used for both a data switch and for a complement data switch.

Figure 7:
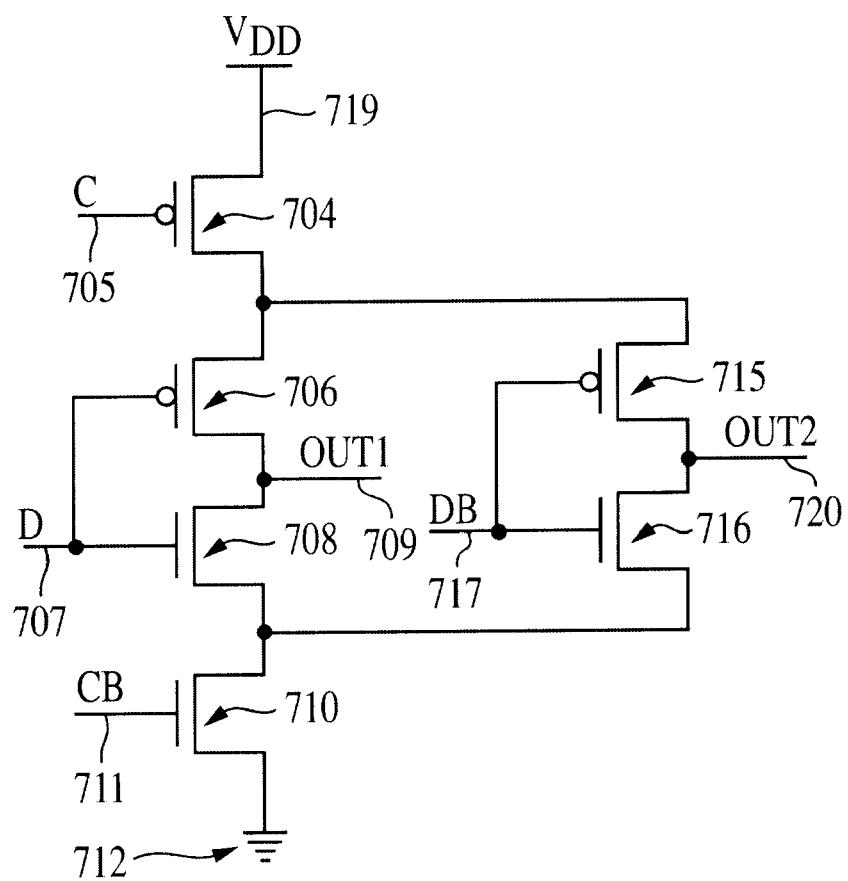
FIG. 7 is a schematic diagram of another illustrative inverter type switch having a tri-stateable output.

FIG. 7 is a schematic diagram of the switch portion of the slave latch 502 providing both data and complement data inputs. The slave switch has an inverter type gate having a tri-stateable output. In this embodiment, two transistors are eliminated relative to the twin totem pole switch embodiment of FIG. 6. A first p-channel transistor 704 and a first n-channel transistor 710 enable and disable the switch. Transistors 704, 710 are shared by the data input signal 707 and complement data input signal 717 switching functions, as further described below. The first p-channel transistor 704 has a source coupled to a reference voltage 719, a gate coupled to a clock signal 705, and a drain. The first n-channel transistor 710 has a source coupled to ground 712, a gate coupled to a complement clock signal 711, and a drain coupled to the Source of transistor 708.

To provide the switching function for the data input signal 707, a second p-channel transistor 706 and a second n-channel transistor 708 switch the data input signal 707 on and off relative to output 709. The second p-channel transistor 706 has a source coupled to the drain of the first p-channel transistor 704, a gate coupled to the data input signal 707, and a drain coupled to a data output terminal 709. The second n-channel transistor 708 has a drain coupled to the data output terminal 709, a gate coupled to the data input signal 707, and a source coupled to the drain of the first n-channel transistor 710.

To provide the switching function for the complement data input signal 717, a third p-channel transistor 715 and a third n-channel transistor 716 are provided. The third p-channel transistor 715 has a source coupled to the drain of the first p-channel transistor 704, a gate coupled to the complement data input signal 717, and a drain coupled to a complement data output terminal 720. The third n-channel transistor 716 has a drain coupled to the complement data output terminal 720, a gate coupled to the complement data input signal 717, and a source coupled to the drain of the first n-channel transistor 710.

When the complement clock signal 711 is high and the clock signal 705 is low, both the first p-channel transistor 704 and the first n-channel transistor 710 are on. Thus, when the data input signal 707 is high, the second n-channel transistor 708 pulls the data output terminal 709 low. At this time the second p-channel transistor 706 is off. When the data input signal 707 is low, the second p-channel transistor 706 is on and pulls the data output terminal 709 high. At this time first n-channel transistor 708 is off.

Likewise, when the complement data input signal 717 is high at the gate of third n-channel transistor 716, the third n-channel transistor 716 pulls the complement data output terminal 720 low. At this time, the third p-channel transistor 715 is off. Finally, when the complement data input signal 717 is low, the third p-channel transistor 715 pulls the complement data output terminal 720 high. At this time, the third n-channel transistor 716 is off and the third p-channel transistor 715 is on.

Figure 8:
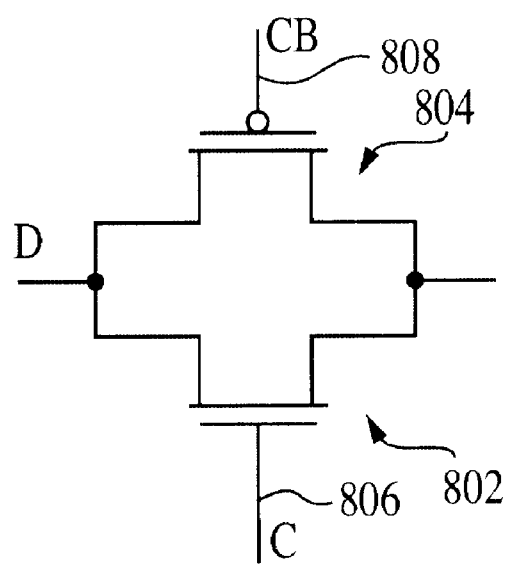
FIG. 8 is a schematic diagram of a switch implemented using a transmission gate.

FIG. 8 is a schematic diagram of a switch implemented as a transmission gate as shown in FIGS. 4 and 5. One alternative to an inverter type gate having a tri-stateable output, for each of the first and second switch elements, is a transmission gate or the like. The transmission gate may have an n-channel transistor 802 and a p-channel transistor 804, with the gate of the n-channel transistor 802 coupled to a clock signal 806 and the gate of the p-channel transistor 804 coupled to a complement clock signal 808, or visa versa. Alternatively, it is contemplated that each of the first and second switch elements may be formed from a single transistor, with the gate of the single transistor coupled to a clock signal. Numerous other configurations are also contemplated.

Having thus described the preferred embodiments of the present invention, those of skill in the art will readily appreciate that the teachings found herein may be applied to yet other embodiments within the scope of the claims hereto attached. For example, the method steps may be taken in sequences other than those described, and more or fewer elements may be used in the block diagrams.

It should be understood that the illustrated embodiments are exemplary only, and should not be taken as limiting the scope of the present invention. For example, a variety of semiconductor technologies, including various devices for creating the various logic gates such as inverters, XOR, NOR and NAND gates may be employed without departing from the scope of the invention itself.

The claims should not be read as limited to the described order or elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

I claim:

1. A master-slave flip-flop comprising:

a clock input for carrying a clock signal having a first and second state;

a master storage device for storing a master data state and a complement master storage data state, said master storage device having a master storage input for receiving a master storage input signal, a master storage complement input for receiving a master storage complement input signal, a master storage output for carrying a master storage output signal, and a master storage complement output for carrying a master storage complement output signal;

a transmission gate having a data input for carrying a data input signal, the data input signal overriding the master storage complement output and the master storage input when the clock is in the first state the transmission gate disconnecting the data input signal from the master complement output and from the master storage input when the clock is in the second state;

a complement transmission gate having a complement data input for carrying a complement data input signal, the complement data input signal overriding the master storage output and the master storage complement input when the clock is in the first state, the complement transmission gate disconnecting the complement data input signal from the master storage output and from the master storage complement input when the clock is in the second state, thereby storing the master data state and the complement master storage data state in the master storage device when the clock is in the second state;

a slave storage device for storing a slave data state and a complement slave storage data state, said slave storage device having a slave storage input for receiving a slave storage input signal, a slave storage complement input for receiving a slave storage complement input signal, a data output for carrying a data output signal, and a complement data output for carrying a complement data output signal; and a slave switch having an inverting master storage output signal to override the data output and the slave storage input when the clock is in the second state, the slave switch having an inverting master storage complement output signal to override the complement data output and the slave storage complement input when the clock is in the second state, the slave switch disconnecting the master storage output signal from the slave storage input and from the data output when the clock is in, the first state, the slave switch disconnecting the master storage complement output signal from the slave storage complement input and from the complement data output when the clock is in the first state thereby storing the slave data state and the complement slave storage data state in the slave storage device when the clock is in the first state, wherein the slave switch is a single amplifying stage having a single gate delay.

2. The master-slave flip-flop of claim 1 wherein the set-up time is approximately one transistor gate delay.

3. The master-slave flip-flop of claim 1,
wherein the master storage device is a pair of master cross-coupled inverters comprising:
a master inverter having an output coupled to the master storage output and an input coupled to the master storage input and to the master storage complement output;
a master complement inverter having an output coupled to the master storage complement output and an input coupled to the master storage complement input and to the master storage output;
wherein the slave storage device is a pair of slave cross-coupled inverters comprising:
a slave inverter having an output coupled to the complement data output and an input forming the slave storage input, wherein the slave storage input is coupled to the data output; and
a slave complement inverter having an output coupled to the data output and an input forming the slave storage complement input; wherein the slave storage complement input is coupled to the complement data output; and wherein the master and the slave pair of cross-coupled inverters each have no cross-coupling resistors to permit a logic level difference.

4. The master-slave flip-flop according to claim 3, wherein the transmission gate has a drive strength greater than a drive strength of the master storage output to override the master inverter and the complement transmission gate has a drive strength greater than a drive strength of the master storage complement output drive strength to override the master complement inverter.

5. The master-slave flip-flop according to claim 4, wherein the slave switch has a drive strength greater than a drive strength of the slave inverter to override the complement output and the slave switch has a drive strength greater than a drive strength of the slave complement inverter to override the output.

6. The master-slave flip-flop according to claim 3,
wherein the master inverter has a master inverter state, the master complement inverter has a master complement inverter state, the slave inverter has a slave inverter state, and the slave complement inverter has a slave complement inverter state, and wherein,
the master inverter state is more quickly set when the data input signal overrides both the master storage output and the master storage input when the clock is in the first state,
the master complement inverter state is more quickly set when the complement data input signal overrides both the master storage complement output and the master storage complement input when the clock is in the first state,
the slave inverter state is more quickly set when the inverted master complement storage output signal overrides both the data output and the slave storage input when the clock is in the second state, and
the slave complement inverter state is more quickly set when the inverted master storage output signal overrides both the complement data output and the slave storage complement input when the clock is in the second state.

7. The master-slave flip-flop according to claim 4 comprising:
a data input driver coupled to the data input of the transmission gate, the data input driver providing a drive current so the data input signal overrides the master storage output; and
a complement data input driver coupled to the complement data input of the complement transmission gate, the complement data input driver providing a complement drive Current so the complement data input signal overrides the master storage complement output.

8. The master-slave flip-flop according to claim 7, wherein the data input driver and the complement data input driver have a voltage gain greater than unity.

9. The master-slave flip-flop according to claim 8, wherein the slave switch has a voltage gain greater than unity.

10. The master-slave flip-flop according to claim 1, wherein the master-slave flip-flop further comprises a complement clock input for carrying a complement clock signal.

11. The master-slave flip flop according to claim 10 wherein the slave switch comprises:
a first p-channel transistor having a gate, a source, and a drain wherein, the source of the first p-channel transistor is connected to a reference voltage, and wherein the gate of the first p-channel transistor receives the clock signal;
a second p-channel transistor having a gate, a source, and a drain, wherein the gate of the second p-channel transistor is connected to the master storage output signal, and wherein the source of the second p-channel transistor is connected to the drain of the first p-channel transistor to form a first junction;
a first n-channel transistor having a gate, a source, and a drain, wherein the gate of the first n-channel transistor is connected to the master storage output signal, and wherein the drain of the first n-channel transistor is connected to the drain of the second p-channel transistor forming a slave switch output to carry a slave switch output signal coupled to the slave storage input and to the data output;
a second n-channel transistor having a gate, a source, and a drain, wherein the gate of the second n-channel transistor receives the complement clock signal, wherein the source of the second n-channel transistor is connected to a ground, and wherein the drain of the second n-channel transistor is connected to the source of the first n-channel transistor to form a second junction;
a third p-channel transistor having a gate, a source, and a drain, wherein the source of the third p-channel transistor is coupled to the first junction, and wherein the gate of the third p-channel transistor is coupled to the master storage complement output; and
a third n-channel transistor having a gate, a source, and a drain, wherein the source of the third n-channel transistor is connected to the second junction, wherein the drain of the third n-channel transistor is connected to the drain of the third p-channel transistor forming a slave switch complement output creating a slave switch complement output signal coupled to the slave storage complement input and to the data complement output, and wherein the gate of the third n-channel transistor is connected to the master storage complement output.

12. The master-slave flip-flop according to claim 11, wherein the transmission gate and the complement transmission gate are controlled by a delayed clock signal that is delayed by a transistor gate delay relative to the clock input and a delayed complement clock is delayed by a transistor gate delay relative to the complement clock.

13. The master-slave flip-flop according to claim 12, wherein a clock to output delay time for the master-slave flip-flop is one transmission gate delay.

14. A method for storing data in a master latch, comprising in combination:

receiving a clock signal having a first and second state;

storing a master data state in a master storage device having a master storage input and a master storage output;

storing a master complement data state in a master complement storage device having a master complement storage input and a master storage complement output;

receiving a data input signal by a transmission gate; receiving a complement data input signal by a complement transmission gate;

overriding the master storage output with the complement data input signal and storing the complement data input signal in the master complement data state when the clock is in the first state;

overriding the master storage complement output with the data input signal and storing the data input signal in the master data state when the clock is in the first state;

disconnecting the master storage complement output from the data input signal when the clock is in the second state;

disconnecting the master storage output from the complement data input signal when the clock is in the second state;

inverting the master storage complement output to produce a slave complement input when the clock is in the second state;

inverting the master storage output to produce a slave input when the clock is in the second state;

overriding a data output with the slave input and storing the slave input when the clock is in the second state; and overriding a complement data output with the slave complement input and storing the slave complement input when the clock is in the second state; and wherein inverting the master storage complement output and inverting the master storage output is performed by a single amplifying stage having a single gate delay.

15. The method of claim 14 wherein the slave complement input is stored in a slave storage device and the slave input is stored in a slave complement storage device.

16. The method of claim 14 wherein the set-up time is approximately one transistor gate delay.

17. The method of claim 14 wherein the data to clock set-up time is the delay through the transmission gate and the delay through the master storage device, and the complement data to clock set-up time is the delay through the complement transmission gate and the delay through the master storage device.

18. The method of claim 14 wherein in overriding the master storage complement output and the master storage output, the transmission gate has a higher relative driving power than a driving power of the master storage device to override the complement data input signal and the complement transmission gate has a higher relative driving power than a driving power of the master storage device to override the data input signal.

19. The method of claim 14 wherein in overriding the master storage complement output and the master storage output, the transmission gate has a gain greater than unity and the complement transmission gate has a gain greater than unity.

20. The method of claim 19 additionally comprising receiving a complement clock input signal corresponding to the first and second state.

21. The method of claim 20 additionally comprising:

receiving a delayed clock signal delayed relative to the clock signal wherein the delayed clock signal has a first state and a second state; and receiving a delayed complement clock signal delayed relative to the complement clock signal wherein the delayed clock signal has a first state and a second state;

wherein overriding the master storage complement output with the data input signal and storing the data input signal in the master data state occurs when the delayed clock is in the first state and the delayed complement clock signal is in the second state; and wherein overriding the master storage output with the complement data input signal and storing the complement data input signal in the master complement data state occurs when the delayed clock is in the first state and the delayed complement clock signal is in the second state.

22. The method of claim 20:

wherein the delayed clock signal is delayed relative to the clock signal by substantially one transistor gate delay; and wherein the delayed complement clock signal is delayed relative to the complement clock signal by substantially one transistor gate delay.

* * * * *

UNITED STATES PATENT AND TRADEMARK OFFICE
CERTIFICATE OF CORRECTION

PATENT NO. : 6,563,356 B2
DATED : May 13, 2003
INVENTOR(S) : Fulkerson

It is certified that error appears in the above-identified patent and that said Letters Patent is hereby corrected as shown below:

Column 10,
Line 36, between "state" and "the transmission", insert -- , --.
Lines 37-38, between "master" and "complement", insert -- storage --.

Signed and Sealed this

Eleventh Day of November, 2003

JAMES E. ROGAN
*Director of the United States Patent and Trademark Office*